United States Patent [19]
McCutchan et al.

[11] Patent Number: 5,864,478
[45] Date of Patent: Jan. 26, 1999

[54] POWER POD/POWER DELIVERY SYSTEM

[75] Inventors: Dan R. McCutchan, Redwood City; William A. Samaras, San Jose; David J. Ayers, Newark, all of Calif.

[73] Assignee: Intel Corporation, Santa Clara, Calif.

[21] Appl. No.: 672,864

[22] Filed: Jun. 28, 1996

[51] Int. Cl.[6] .................................................. H02M 1/00
[52] U.S. Cl. ........................................... 363/147; 361/764
[58] Field of Search ................................. 439/68, 70, 74, 439/79; 361/728, 729, 730, 760, 761, 764, 767–783, 794; 363/147

[56] References Cited

U.S. PATENT DOCUMENTS

| | | | |
|---|---|---|---|
| 4,992,925 | 2/1991 | Meyer | 363/141 |
| 5,117,330 | 5/1992 | Miazga | 361/400 |
| 5,289,364 | 2/1994 | Sakurai | 363/147 |
| 5,359,495 | 10/1994 | Margalit et al. | 361/760 |
| 5,497,289 | 3/1996 | Sugishima et al. | 361/709 |
| 5,548,484 | 8/1996 | Kantner | 361/737 |
| 5,626,480 | 5/1997 | Baumbaugh | 439/64 |
| 5,627,413 | 5/1997 | Mughir et al. | 439/68 |

*Primary Examiner*—Peter S. Wong
*Assistant Examiner*—Derek J. Jardieu
*Attorney, Agent, or Firm*—Kenyon & Kenyon

[57] ABSTRACT

A power delivery system includes a circuit board, a power consuming module and a dc—dc converter. The printed circuit board has on it a first signal connector, a pair of first contacts to which a first voltage is supplied, spaced from said connector, and fasteners spaced from said pair of first contacts. The power consuming module has a second signal connector, mating with the first signal connector, and has respective upper and lower power pads for receiving low voltage power. The dc—dc converter converts the first voltage to a lower voltage. The dc—dc converter has a pair of second contacts contacting said pair of first contacts, surfaces mating with said fasteners and holding the converter on the printed circuit board such that said second contacts are in firm contact with said first contacts, and a laterally extending connector having upper and lower contacts supplying the lower voltage and engaging the upper and lower power pads of the power consuming module.

24 Claims, 4 Drawing Sheets ns. 5,864,478

POWER POD/POWER DELIVERY SYSTEM

BACKGROUND OF THE INVENTION

This invention relates to power delivery to electronic circuits in general and more particularly to an improved power delivery system for supplying power to a power consuming module.

Along with the development of higher levels of integration in integrated circuits, power requirements have increased. This is particularly true with current microprocessor and associated integrated circuits or chips recently developed and now being developed. These chips, which are operating at higher speeds, consume greater amounts of power than previously.

In a typical computer system, a large printed circuit board known as a motherboard is provided. The motherboard contains a certain number of basic components and is supplied with voltage from a power supply, typically at a higher DC level (e.g., 12 volts) than required by the components on the motherboard. The motherboard includes connectors for daughter boards which can be plugged in to provide different capabilities for the computer. Such boards, for example may provide an interface to disk drives and CD ROMs, modem interfaces for local area networks, etc. Typically, these circuits operate on the 12 volts which is on the board or on reduced voltages of 5 volts. Power consumption is not typically very high. Current processors however have been designed to operate at lower voltages, e.g., 3.3 volts. Because of the increased capability and speed of these processors they consume a large amount of power despite their lower voltage. Their operation at a lower voltage requires a dc-to-dc power converter to reduce the voltage. Typically, this dc-to-dc power converter is soldered to the mother board or plugs into a connector on the motherboard. The lower voltage is then conducted through conductors or traces on the motherboard to a connector for the component requiring the lower voltage, e.g., a processor. This same connector also provides signal connections. In current systems, one or more processors and in some cases associated chips are mounted on a board or module. This module then plugs into the connector on the motherboard. Since the voltage required by the processor is lower, and the power consumption is high, the currents which must be supplied to the module become particularly large. As a result, it is difficult to establish a low resistance, low inductance path on the motherboard from the dc-to-dc converter board to the multi-chip module. This is particularly true since the prior art arrangement requires that the high current pass through two connectors, one from the dc-to-dc converter into the motherboard and another connector from the motherboard through the module connector to the module. Also, the prior art arrangement presents difficulties in manufacture because the dc-to-dc converter becomes an additional component that must be tested with the remaining components on the motherboard.

Thus, there is the need for an improved arrangement for delivering power to a power consuming module requiring high amounts of power at a lower voltage, which voltage must be converted from a higher voltage.

SUMMARY OF THE INVENTION

On a printed circuit board, e.g., a motherboard, a connector, e.g., a socket for the power consuming module, e.g., a multichip module is provided. This connector, unlike connectors of the prior art, is only a signal connector; it does not provide power connections. Spaced from this socket is a higher voltage connection, e.g., a 12 volt power connector or a pair of contacts across which 12 volts is supplied. These connect to, for example, 12 volt and ground buses on the motherboard. Also provided on the printed circuit board, if necessary, are fasteners, e.g., spring clips, screws, etc., for holding a dc-to-dc converter. A dc-to-dc converter within a housing is provided and includes a pair of pins or contacts, to mate with the higher voltage connector contacts on the board. It has surfaces on the housing for engaging the fasteners on the board, e.g., the dc-to-dc converter includes recesses on opposite sides into which fasteners in the form of spring clips on the board snap. Extending from the converter housing is a connector which may be rigidly or flexibly mounted, to the converter housing. The connector has contacts, to supply dc power at the required reduced voltage level. These may be upper and lower contacts. The power consuming module includes power pads on one edge and plugs into the laterally extending connector of the dc-to-dc converter so that contact is made along an extended length. For example, with a rectangular module, the power pads can extend along one edge of the module. The power pads connect to power planes on the power consuming module. In the illustrated embodiment these comprise a ground plane on one side and a voltage plane on the other side. On its bottom surface, the power consuming module includes contacts, e.g., pins which mate with the connector on the board.

DETAILED DESCRIPTION

Figure 1:
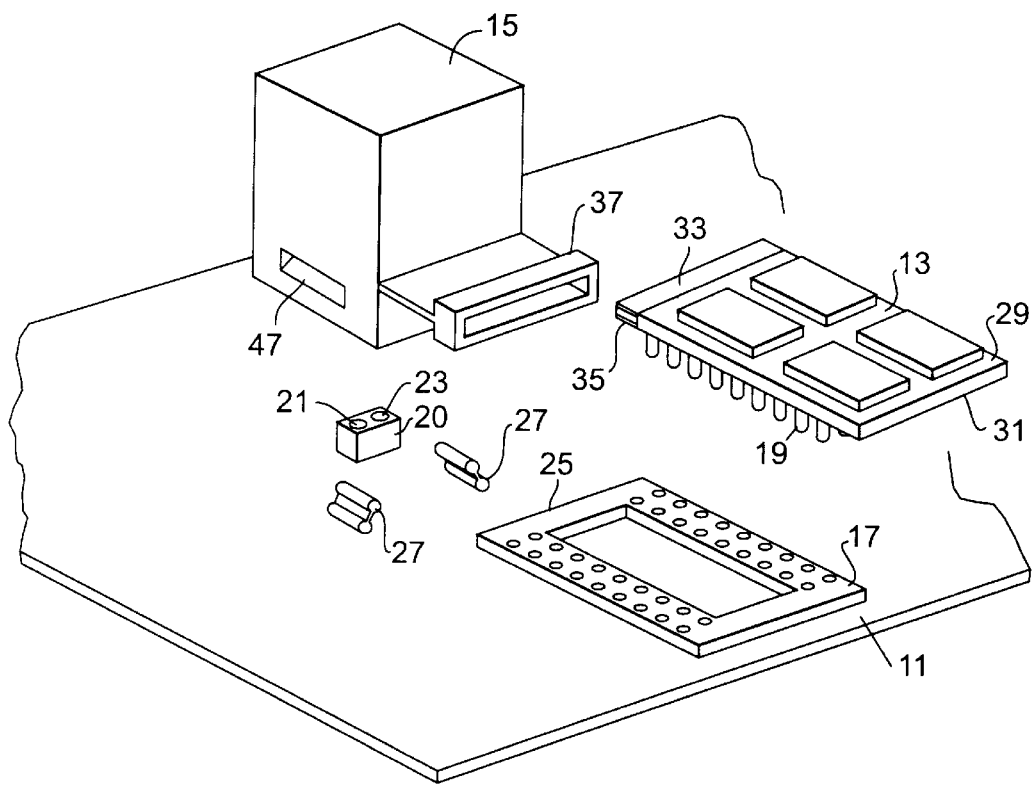
FIG. 1 is a perspective view showing the major components of the present invention separated from each other.

FIG. 1 is a perspective view illustrating the basic components which make up the present invention. The three basic elements are a motherboard 11, a power consuming module 13, and a dc-to-dc power converter 15. In the illustrated embodiment, the module 13 is a multi-chip module. However, the present invention is equally applicable to a module with only one chip. The converter 15 includes conventional voltage conversion circuits within a housing having a rectangular cross section. The motherboard has mounted thereon a first connector 17 in the form of a socket for receiving pins 19 on the multi-chip module 13. The connector 17 is a signal connector only. As compared to prior art connectors, the number of pins required on the power consuming module is reduced, thereby lowering the package insertion and removal forces required. In the illustrated embodiment, the connector is what is known as a PGA connector. An LGA or BGA or other type connector could equally well be used. In conventional fashion the connector 17 includes rows of receptacles to receive pins along the lateral edges thereof. Although the multi-chip module 13 can contain any type of electronic component which requires large amounts of power, in a typical embodiment, this module will contain one or more high speed processors and possibly associated circuits.

Also mounted on the motherboard is a connector 20 with two terminals 21 and 23 into which mating pins may be plugged. Other types of connectors, including contacts directly on the motherboard 11 may be used as terminals. These terminals connect to buses (not shown) on motherboard 11 and supply a voltage higher than that required by the module 13, e.g., +12 volts and ground. The connector 20 is spaced from the rear edge 25 of the connector 17. In the illustrated embodiment, between the connector 17 and the connector 20 are fasteners 27 which can be in the form of spring clips. Other forms of fastening may also be used, if fasteners are required. The module 13 has upper and lower power planes, in the illustrated embodiment, on its top and bottom surfaces 29 and 31. These terminate in planar power pads 33 and 35 on the top and bottom surfaces of its rear lateral edge. Other arrangements are also possible such as side-by-side power pads, etc. The key requirement is a structure which provides a low inductance, low resistance current path. The dc-to-dc converter includes an extending connector 37 which can be mounted to the housing in a flexible or rigid manner. This connector 37 has, for example, upper and lower contact surfaces which mate with the power pads 33 and 35 on the multi-chip module. These upper and lower contact surfaces can be a power plane and a ground plane.

Figure 2A:
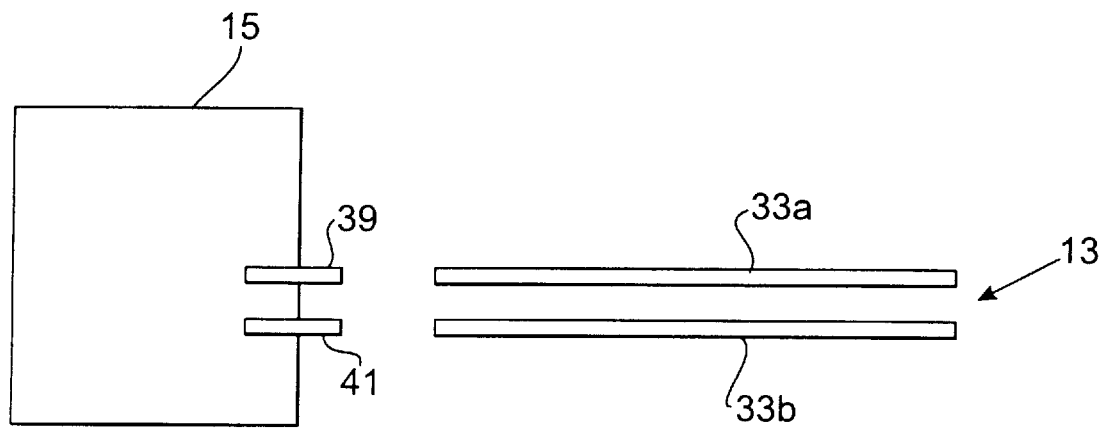
FIG. 2a is a side and FIG. 2b a top schematic view illustrating the power planes of a module to which power is being supplied extending into the connector from the dc-to-dc converter.
Figure 2B:
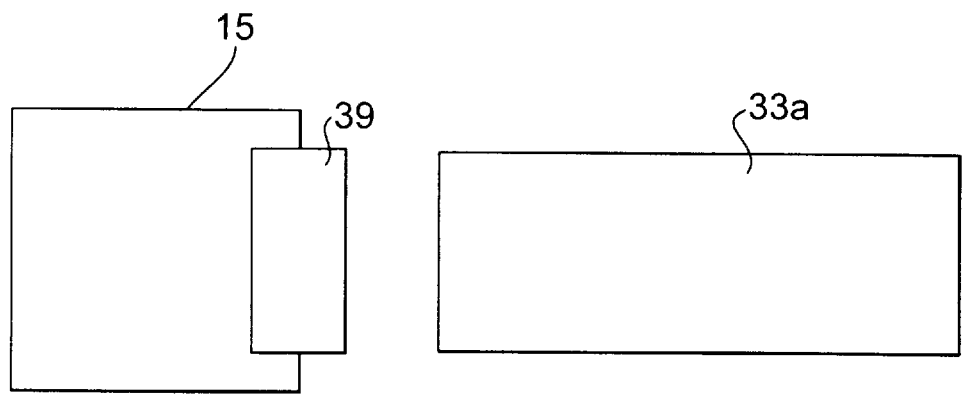

This connection is further illustrated in the schematic views of FIGS. 2a and b which are respectively a side view and top view of the dc-to-dc converter 15 and the module 13 illustrating schematically the manner in which the power planes 33a and 35a of the multi-chip module extend into the dc-to-dc converter contact surfaces 39 and 41. This results in an interconnect that is a contained, low resistance, low inductance path between the dc-to-dc converter and the multi-chip module. Also, power is advantageously provided to a power consuming module 13 through a connector 37 that is separate and independent from the signal connector 17. The increased dc currents to the power consuming module never flow on the motherboard. Instead of two interfaces, there is a single interface connector and the power converter is separable from the motherboard.

Figure 3:
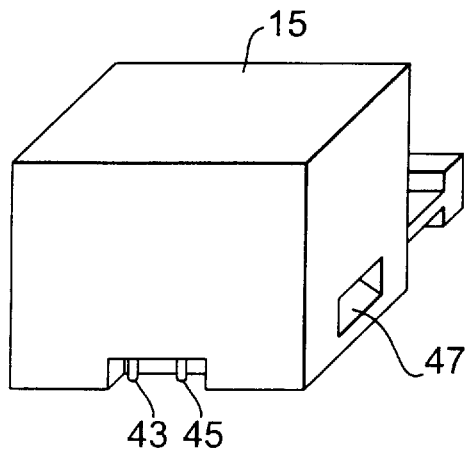
FIG. 3 is a rear perspective view of the dc-to-dc converter of FIG. 1 showing its higher voltage contacts.

FIG. 3 is a view of the dc-to-dc converter 15 rotated such that the rear surface of its housing is visible. As illustrated, it includes, at the back of the dc-to-dc converter, extending from the bottom of the housing thereof, pins 43 and 45 which mate with the terminals 21 and 23 in the connector 20 when the dc-to-dc converter 15 is inserted onto the motherboard 11. The force of the pins 21 and 23 may be sufficient to hold the dc—dc converter 15 in place. However, in the illustrated embodiment an additional fastener is also provided. Thus, also visible in this view is one of the indentations or recesses 47 found on the sides of the dc-to-dc converter housing into which the spring clips 27 snap when the dc-to-dc converter is mounted on the motherboard 11. The spring force of the spring clips holds the dc-to-dc power converter securely on the motherboard 11. If fastening beyond that provided by the connector 20 and pins 43 and 45 is needed, alternative fasteners such as screws, can equally well be used. In a manner known to those skilled in the art, circuits in the dc-to-dc power converter 15 then convert this higher voltage to a lower voltage which is supplied at its contacts 39 and 41 and thence to the power pads 33 and 35 of the multi-chip module.

Figure 4:
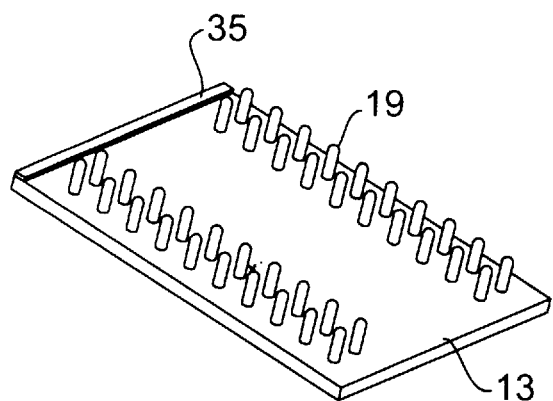
FIG. 4 is a bottom perspective view of the multi-chip module of FIG. 1 showing its pins and bottom power pad.

FIG. 4 is a view of the module 13 turned upside down so that the bottom power pad 35 is visible along with the pins 19.

Figure 5:
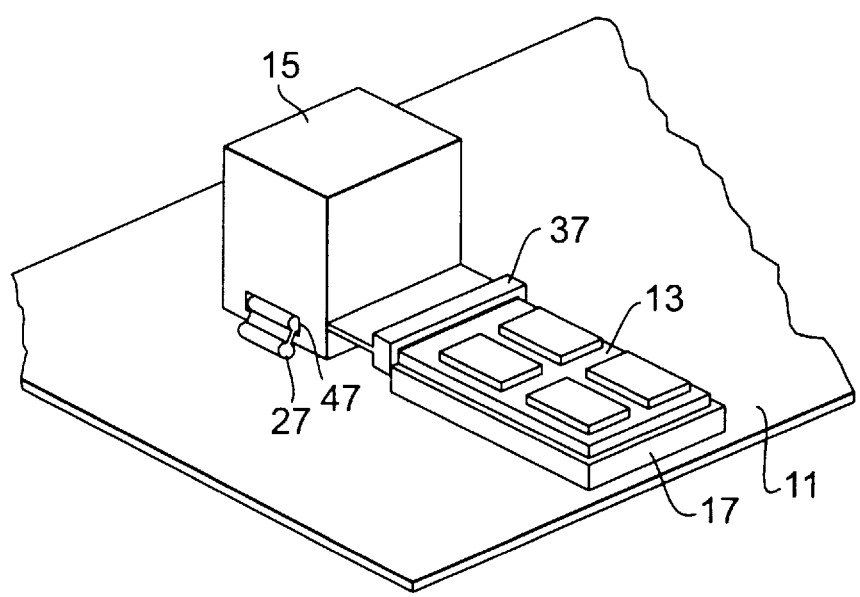
FIG. 5 is a perspective view showing the components of the present invention in an assembled condition.

FIG. 5 is a perspective view showing the components assembled. The module 13, after having its edge inserted into the connector 37 has the pins 19 on the bottom thereof inserted into the connector 17. As illustrated, this manner of installing the dc—dc converter provides manufacturing advantages in that the dc-to-dc converter can be separately tested and simply inserted onto the motherboard; the need to construct and test the dc-to-dc converter on the motherboard is eliminated. The dc-to-dc converter 15 is held in contact with the motherboard 11 by the spring clips 27 engaging in the recesses 47. Although spring clips are illustrated, other forms of fastening are possible such as screws passing through tabs having corresponding holes on the dc—dc converter, into threaded bores in the circuit board.

Figure 6:
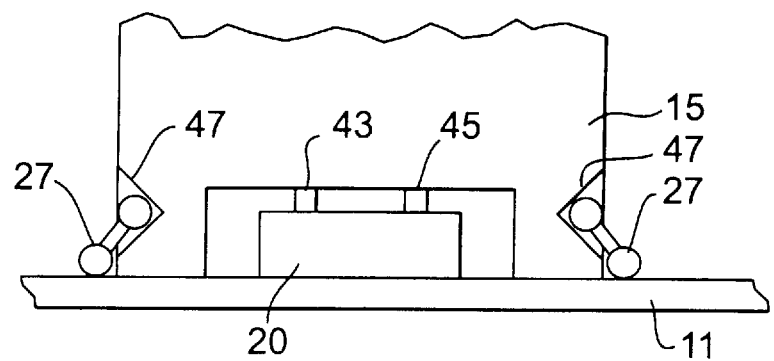
FIG. 6 is a cross section through the rear portion of the dc-to-dc converter and motherboard showing the spring clip attachment and the contacting of the contacts of the dc-to-dc converter with the contacts on the motherboard.

As illustrated by the rear view of FIG. 6, the fastening assembly described above maintains the dc-to-dc converter 15 in good contact with the motherboard 11, and prevents the connection between pins 43 and 45 and the terminals in connector 20 from being broken.

What is claimed is:

1. A power delivery system comprising:
    a) a printed circuit board having thereon:
        i) a first signal connector; and
        ii) a pair of terminals across which a first voltage is supplied spaced from said connector;
    b) a power consuming module having a second signal connector mating with said first signal connector, said power consuming module having first and second power pads; and
    c) a dc—dc converter converting said first voltage to a lower voltage, the dc—dc converter including:
        I) a pair of contacts contacting said pair of terminals; and
        ii) a power connector having first and second power contacts supplying said lower voltage and engaging said first and second power pads of said power consuming module.

2. A power delivery system according to claim 1, and further comprising fasteners on said printed circuit board, and surfaces on said dc—dc converter engaged by said fasteners.

3. A power delivery system according to claim 2, wherein said pair of contacts comprise pins on a bottom of said dc—dc converter.

4. A power delivery system according to claim 3, wherein said fasteners comprise spring clips.

5. A power delivery system according to claim 4, wherein said surfaces on said dc—dc converter for mating with said fasteners comprise recesses for receiving said spring clips.

6. A power delivery system according to claim 1, wherein said first and second power pads comprise upper and lower power pads and said first and second power contacts comprise upper and lower power contacts.

7. A power delivery system according to claim 6, wherein said upper and lower power contacts and said upper and lower power pads are planar.

8. A power delivery system according to claim 7, wherein said power consuming module has a power plane on one side thereof and a ground plane on another side thereof and wherein said planes terminate in said power pads.

9. A power delivery system according to claim 8, wherein said power consuming module comprises a multi-chip module.

10. A power delivery system according to claim 6, wherein said multi-chip module includes a processor and associated chips.

11. A power delivery system according to claim 10, and further including fasteners on said printed circuit board and surfaces on said dc—dc converter engaged by said fasteners.

12. A power delivery system according to claim 11, wherein said pair of contacts is on a bottom of said dc—dc converter.

13. A power delivery system according to claim 12, wherein said fasteners comprise spring clips.

14. A power delivery system according to claim 13, wherein said surfaces on said dc—dc converter for mating with said fasteners comprise recesses for receiving said spring clips.

15. A power delivery system according to claim 14, wherein said dc—dc converter has a rectangular cross section at its base and said connector is a laterally extending connector extending from a front side of said dc—dc converter, said recesses are on sides of said module and said mating contacts are at a rear side of said module.

16. A power delivery system according to claim 15 wherein said laterally extending connector is flexibly mounted to said dc—dc converter.

17. A power delivery system according to claim 15 wherein said laterally extending connector is rigidly mounted to said dc—dc converter.

18. A power delivery system according to claim 17 wherein said first signal connector on said printed circuit board is rectangular and contains rows of receptacles for receiving pins along two lateral edges thereof.

19. A method of supplying power to a power consuming module, in a system including a printed circuit board having thereon a first voltage and a signal connector for said power consuming module, the power consuming module having first and second power pads for receiving voltage at a second, lower voltage from a dc—dc converter having a pair of contacts for receiving the first voltage and having a connector including first and second power contacts at which said second voltage is provided comprising:

mounting said dc—dc converter to said printed circuit board such that said pair of contacts on said dc—dc converter are held in contact with mating terminals on said printed circuit board;

mating said first and second power pads of said module with the first and second power contacts in said connector; and mating said power consuming module with the signal connector mounted on a motherboard.

20. A dc—dc converter, converting a first voltage to a lower voltage including:
 a) a housing containing circuits for converting a first dc voltage to a lower dc voltage;
 b) a pair of contacts on said housing capable of receiving said first dc voltage; and
 c) a connector having first and second power contacts, adapted to engage first and second power pads of a power consuming module, supplying said lower voltage.

21. The apparatus of claim 20 further wherein said connector includes
 a power plane adapted to engage said first power pad and
 a ground plane adapted to engage said second power pad.

22. A method of supplying power to a power consuming module, said module having a signal connector through which signals are supplied and first and second power pads adapted to receive dc power, comprising supplying dc power to said power pads of said module through a connector having first and second low inductance, low resistance contacts separate and independent from said signal connector.

23. A power delivery system comprising:
 a power consuming module which is supplied with signals through connections having a first inductance and having first and second power pads adapted to receive dc power;
 a dc—dc converter; and
 a connector having first and second contacts with a second inductance lower than said first inductance coupled between said first and second power pads of said power consuming module and said dc—dc converter.

24. The power delivery system of claim 23 wherein said connector having a second inductance comprises a power plane and a ground plane.

* * * * *